United States Patent [19]

Hara et al.

[11] Patent Number: 5,155,523

[45] Date of Patent: Oct. 13, 1992

[54] WORKPIECE SUPPORTING MECHANISM

[75] Inventors: Shinichi Hara, Atsugi; Shunichi Uzawa, Nakamachi, both of Japan

[73] Assignee: Canon Kabushiki Kaisha, Tokyo, Japan

[21] Appl. No.: 350,648

[22] Filed: May 11, 1989

[30] Foreign Application Priority Data

May 11, 1988 [JP] Japan .................. 63-112628

[51] Int. Cl.⁵ .................. G03B 27/42; G03B 27/32
[52] U.S. Cl. .................. 355/53; 355/77
[58] Field of Search .................. 355/53, 77; 356/400, 356/401; 269/21

[56] References Cited

U.S. PATENT DOCUMENTS

| | | | |
|---|---|---|---|
| 3,569,718 | 3/1971 | Borner | 250/201 |
| 4,553,834 | 11/1985 | Ayata et al. | 355/53 |
| 4,595,282 | 6/1986 | Takahashi | 355/53 |
| 4,711,567 | 12/1987 | Tanimoto | 355/53 |
| 4,723,086 | 2/1988 | Leibovich et al. | 310/328 |
| 4,875,076 | 10/1989 | Torigoe et al. | 355/53 |
| 5,063,582 | 11/1991 | Mori et al. | 355/53 X |

Primary Examiner—L. T. Hix
Assistant Examiner—D. Rutledge

[57] ABSTRACT

A workpiece supporting mechanism, suitably usable in an exposure apparatus, is disclosed. The mechanism includes a workpiece supporting member which is provided with a displacement sensor such as a speed sensor or an acceleration sensor. A vibrator such as a piezoelectric device is added to the supporting member or a stage which supports the supporting member. Any vibration of the workpiece or the supporting member is detected by the displacement sensor and, in accordance with the detection, the vibrator is energized to cancel the vibration of the workpiece and the workpiece supporting member.

30 Claims, 9 Drawing Sheets

WORKPIECE SUPPORTING MECHANISM

FIELD OF THE INVENTION AND RELATED ART

This invention relates to a mechanism, suitably usable in an exposure apparatus for exposing with radiation a workpiece such as a semiconductor wafer having a radiation-sensitive material coating to a pattern formed on a mask, for supporting such a workpiece.

An example of a workpiece supporting mechanism used in a known type a exposure apparatus is schematically illustrated in FIG. 1. Denoted in this Figure at 1 is a workpiece; at 2 is a workpiece support; at 3 is a leaf spring; at 4 is a shaft; and at 5 is a stage. The workpiece support 2 for carrying thereon the workpiece 1 is fixed to the stage 5 by means of the leaf spring 3 (which may be a bearing) and the shaft 4. The stage 5 is made vibration-free by using an air-cushion, for example.

Conventionally, because of the fact that the fine pattern printing as being made at present has not been executed, with regard for vibrations or for any other reason, if in this structure the vibration of the stage 5 is prevented sufficiently, any vibration of the workpiece support 2 causes only such a small amount of displacement of the workpiece 1 that it can be disregarded.

Recently, however, a high-power radiation source is used for formation of extraordinarily fine patterns on a workpiece. This leads to an inconvenience that, due to the heat which might be caused by absorption or scattering, at the workpiece, of the radiation beam from such a radiation source or due to the heat from the stage or the ambience, heat expansion occurs in the workpiece and/or the workpiece support, resulting in displacement of an amount that cannot be disregarded. In consideration of this, it may be considered to use a system for cooling the workpiece and the workpiece support. However, if such a cooling system is used, there is a possibility that, due to the tube friction and the pulsation of cooling water as it passes a flow passageway, an undesirable force is applied to the workpiece and the workpiece support. Such a force causes vibration of the workpiece and the workpiece support, which results in displacement of an amount of N/1000-N/100 micron (N being an integer). Inconveniently, this makes it difficult to accomplish high-precision alignment required for formation of extraordinarily fine patterns.

SUMMARY OF THE INVENTION

It is accordingly an object of the present invention to provide a workpiece supporting mechanism, suitably usable in an exposure apparatus, which mechanism is effective to suppress vibration of a workpiece and a workpiece support to thereby prevent degradation of pattern forming precision due to vibration of the workpiece during the exposure.

In accordance with an aspect of the present invention, to achieve this object, the workpiece supporting mechanism includes a workpiece support which is provided with displacement sensor means comprising one or more speed sensors or acceleration sensors, for example. Additionally, there is provided vibrator means which may comprise one or more piezoelectric devices, for example, for causing displacement of the workpiece, the vibrator means being mounted to the workpiece support or a stage that supports the workpiece support. With this arrangement, any vibration of the workpiece or the workpiece support can be detected by the displacement sensor means and an output signal, based on the detected vibration, is applied to the vibrator means. In response, the vibrator means provides vibrating motion that can cancel the vibration of the workpiece and the workpiece support.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Figure 1:
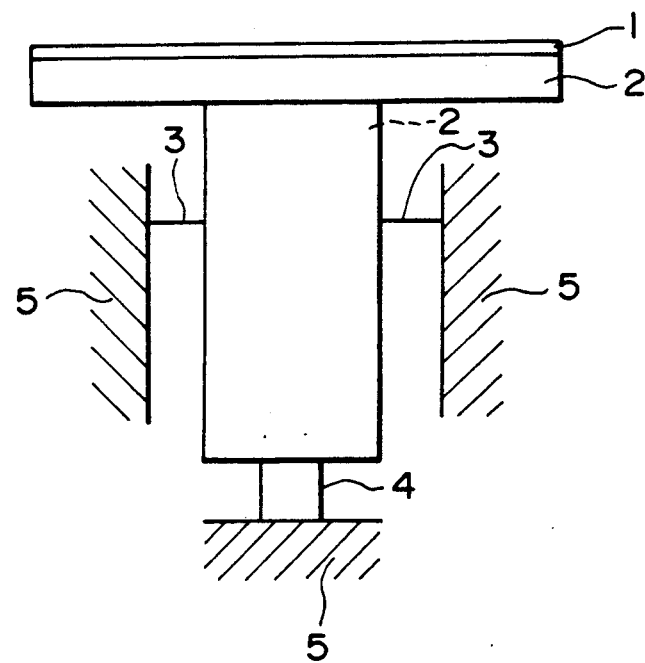
FIG. 1 is a schematic view showing a major portion of a workpiece supporting mechanism used in a conventional exposure apparatus.
Figure 2:
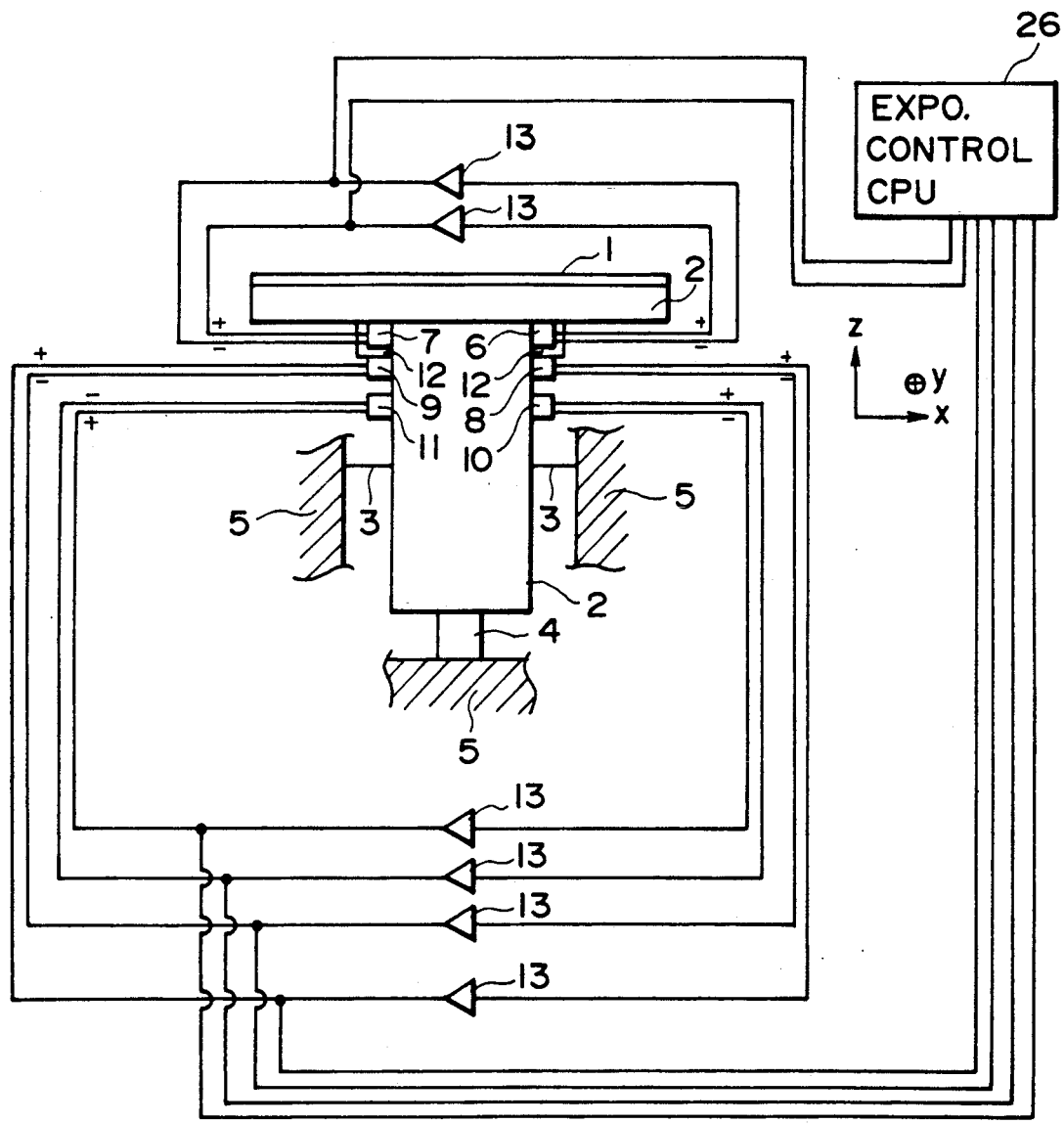
FIG. 2 is a schematic view showing a major portion of a workpiece supporting mechanism according to a first embodiment of the present invention.
Figure 4:
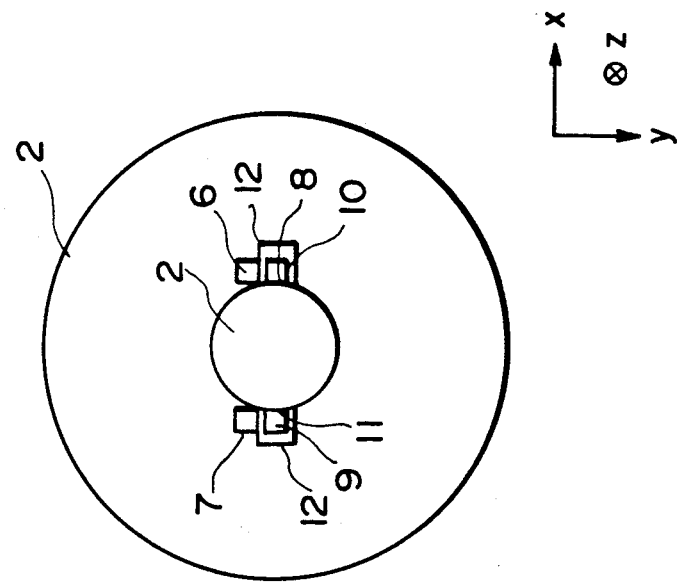
FIG. 4 is a plan view of the workpiece supporting mechanism of the present embodiment, as seen in the direction of an arrow A in FIG. 3.
Figure 3:
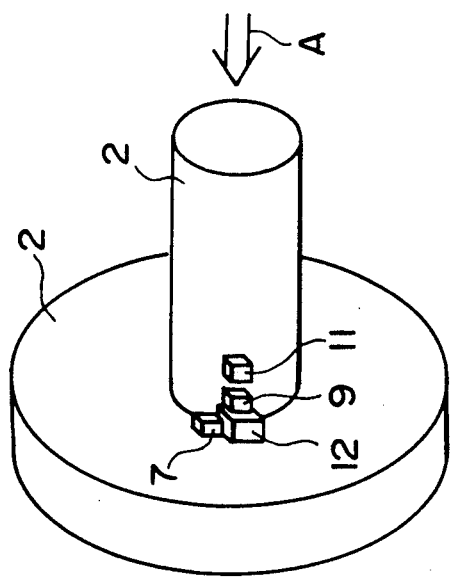
FIG. 3 is a perspective view showing, three dimensionally, the workpiece supporting mechanism of the present embodiment.

Referring now to FIGS. 2-4, FIG. 2 is a schematic view showing a major portion of a workpiece supporting mechanism according to a first embodiment of the present invention; FIG. 3 is a perspective view showing, three-dimensionally, the workpiece supporting mechanism of this embodiment; and FIG. 4 is a plan view of the workpiece supporting mechanism of this embodiment, as seen in the direction of an arrow A in FIG. 3. In FIGS. 2-4, like reference numerals are assigned the to same constituent elements.

In FIGS. 2-4, denoted at 1 is a workpiece such as a semiconductor wafer; at 2 is a workpiece support for holding the workpiece 1 by means of a vacuum chucking, for example; at 3 is a leaf spring means by which the workpiece support 2 is fixed to a stage; at 4 is a shaft member for fixing the workpiece support 2 to the stage and for providing a rotational displacement; at 5 is the stage for supporting the workpiece support 2; at 6 is an acceleration sensor having a sensitivity to the acceleration in a y-axis direction; at 7 is a vibrator comprising a piezoelectric device; for example, for causing displacement in the y direction; at 8 is an acceleration sensor having a sensitivity to the acceleration in a z-axis direction; at 9 is a vibrator comprising a piezoelectric device, for example, for causing displacement in the z direction; at 10 is an acceleration sensor having a sensitivity to the acceleration in an x-axis direction; at 11 is a vibrator comprising a piezoelectric device, for example, for causing displacement in the x direction; at 12 is a fixing means for mounting the acceleration sensors and the vibrators (piezoelectric devices, for example) to the workpiece support 2; and at 13 are amplifiers each being adapted to amplify an output of a corresponding acceleration sensor. Denoted at 26 is an exposure control central processing unit (CPU) which is operable to monitor the outputs of the acceleration sensors, for example.

For convenience of explanation, a coordinate system including axes of x, y and z as depicted in FIGS. 2 and 4 is determined. In FIG. 2, the symbols "+" and "−" assigned to lead wires of the acceleration sensors 6, 8 and 10 represent that, if the workpiece support 2 vibrates to produce an acceleration in a direction of +x, +y or +z, a corresponding one of the acceleration sensors 6, 8 and 10 produces and applies a positive potential to a lead wire denoted by "+", in comparison with that denoted by "−". Also, the symbols "+" and "−" assigned to lead wires connected to the piezoelectric devices 7, 9 and 11 represent those polarities that, if a positive potential is applied to each lead wire denoted by "+" of the piezoelectric device 7, 9 and 11, in comparison with that denoted by "−", the piezoelectric device 7, 9 and 11 produce positive displacements in the directions of +x, +y and +z, respectively.

Figure 5:
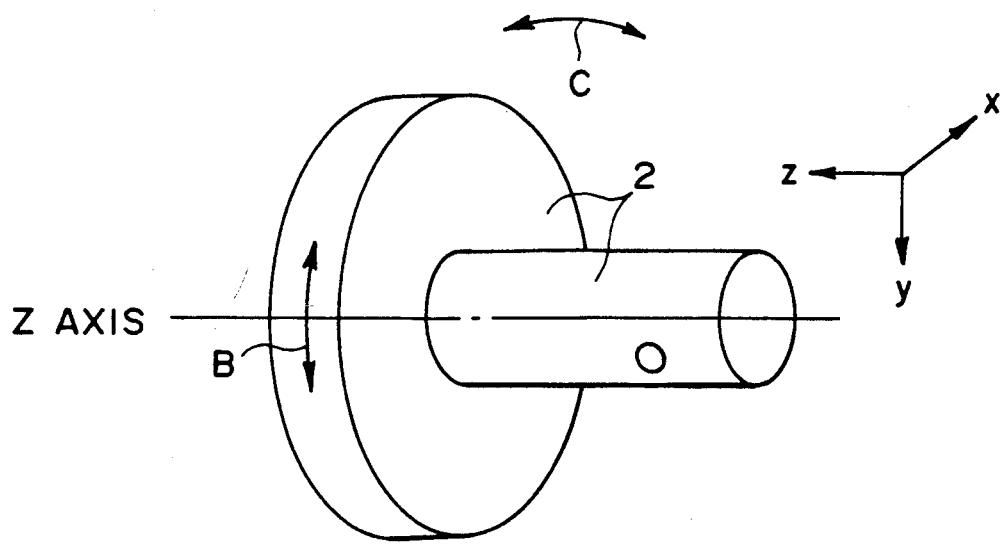
FIG. 5 is a perspective view of the workpiece supporting mechanism of the present embodiment, like FIG. 3, showing the vibration of a workpiece support.

FIG. 5 is a perspective view, like FIG. 3, showing a workpiece supporting mechanism according to the present embodiment. In this example, vibration of the workpiece support 2 is considered as being chiefly in a rotational direction (direction of an arrow B) about the z axis shown in FIG. 4 as well as in a rotational direction (direction of an arrow C) about a center O and around the x axis.

Referring to FIGS. 2-5, the operation of the present embodiment will be explained, particularly with respect to suppressing vibration of the workpiece support 2 in a rotational direction about the z axis.

Figure 6:
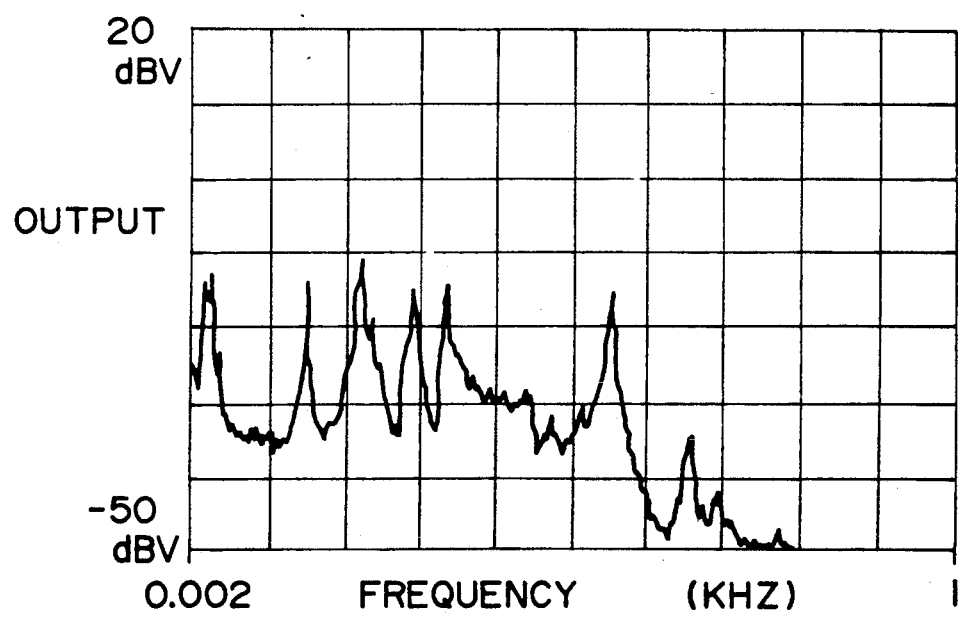
FIG. 6 is a graph showing the frequency characteristics of an output of an acceleration sensor, having been amplified by an amplifier.

As an example, it is now assumed that, in the above-described structure, an impact is applied to the workpiece support 2. Any acceleration caused at this time in a direction about the z axis can be detected by the y-direction acceleration sensor 6. An output of this acceleration sensor 6, after being amplified by a corresponding amplifier 13, has a frequency characteristic such as shown in the graph of FIG. 6. It is seen from this graph that there are peaks adjacent to 160 Hz, 210 Hz, 300 Hz, 330 Hz and 560 Hz (the peak adjacent to 20 Hz is noise). Each peak represents a natural vibration frequency of the above structure in the y direction. Usually, of these natural vibration frequencies, such as one as having a low frequency or having an outstanding peak may be considered as one dominating the vibration in that structure. If, therefore, the displacement caused by such as natural vibration frequency can be cancelled, the vibration of that structure can be sufficiently attenuated. Based on this, the operation of the mechanism according to the present invention will be explained in greater detail.

From FIG. 6, it is assumed that the natural vibration frequency that dominates the vibration of the structure in the y direction is 160 Hz. For convenience of explanation, here only the correction of the vibration in the y direction will be considered. Assuming now that the vibration is about the z axis and has a frequency f with a displacement x, the acceleration a can be given by the following equation:

$$a = (2\pi f)^2 \cdot x$$

According to this, the acceleration sensor 6 having a sensitivity in the y direction in FIG. 2 produces an output V = a·s (where s is the sensitivity of the acceleration sensor). In the system of FIG. 2 including the workpiece support 2, the leaf spring means 3, the shaft member 4 and the stage 5, if the natural vibration frequency in the y direction is 160 Hz, then the vibration which might be caused as a result of water cooling or otherwise will be mainly at a frequency of 160 Hz. As an example, it is now assumed that, at the position of the acceleration sensor 6, the workpiece 1 and the workpiece support 2 vibrate in the y direction at a number of vibrations of 160 Hz with a displacement of 0.01 micron. If, on that occasion, the acceleration sensor 6 has a sensitivity of 1 mV/(m/sec$^2$), the acceleration sensor produces an output of −100 dBv.

On the other hand, it is assumed as an example that, when a signal of a frequency 160 Hz and an amplitude 0 dBv is applied to the piezoelectric device 7, a resultant vibration in the y direction causes a displacement of 0.01 micron. On that occasion, in order to suppress the displacement, in the y direction through 0.01 micron, of the workpiece 1 and the workpiece support 2 at the position of the acceleration sensor 6, the output of the acceleration sensor 6 may be applied as an input signal to a corresponding amplifier 11 in which the signal may be amplified by 100 dB, and an output signal of that amplifier 13 may be applied to the piezoelectric device 7 while maintaining the phase of the signal as it is. By this, the vibration in the y direction (vibration in the direction of an arrow B in FIG. 5) can be suppressed. It will be understood from the foregoing that, in the present embodiment, the gain of each amplifier may be set, while taking into account the output characteristic of a sensor and the characteristic of a vibrator (piezoelectric device in this embodiment), so that the displacement, which may occur at the natural vibration frequency that dominates the vibration of the structure, may be cancelled by the vibrator.

In a similar manner, any vibration in the x direction or the z direction can be suppressed, by using the acceleration sensor 10 or 8 and the piezoelectric device 11 or 9.

Since, in the structure of the above example, the acceleration sensor 6 and the piezoelectric device 7 are so disposed as to be opposed to each other with a center line (in the z-axis direction) of the workpiece support 2 sandwiched therebetween, such a signal as having the same phase as that of the output of the acceleration sensor 6 is applied to the piezoelectric device 7. On the other hand, as regards the vibration in the x direction, from the positional relationship between the acceleration sensor 10 and the piezoelectric device 11, it is necessary that a signal having an opposite phase as compared to the output of the acceleration sensor 10 is applied to the piezoelectric device 11.

This is, however, only because of the positional relationship between the acceleration sensor and the piezoelectric device, which is adopted in this example. If, therefore, the acceleration sensor and the piezoelectric device are placed in a different positional relationship, the output of the displacement sensor may of course be applied to the vibrator with a suitable gain and phase, determined while taking into account the adopted positional relationship between the sensor and the vibrator as well as the response characteristics to the vibration at the workpiece support.

Further, although description has been made to vibrations in the x, y and z directions in FIG. 2, the description substantially applies to such a vibration in only one of these directions or to a vibration in a composite direction. The invention is not limited to that which as been described.

In the structure of the present embodiment as described hereinbefore, in order to obtain a better result, the vibrator (piezoelectric device, for example) may preferably have a sufficient weight as compared with the workpiece support.

Figure 7:
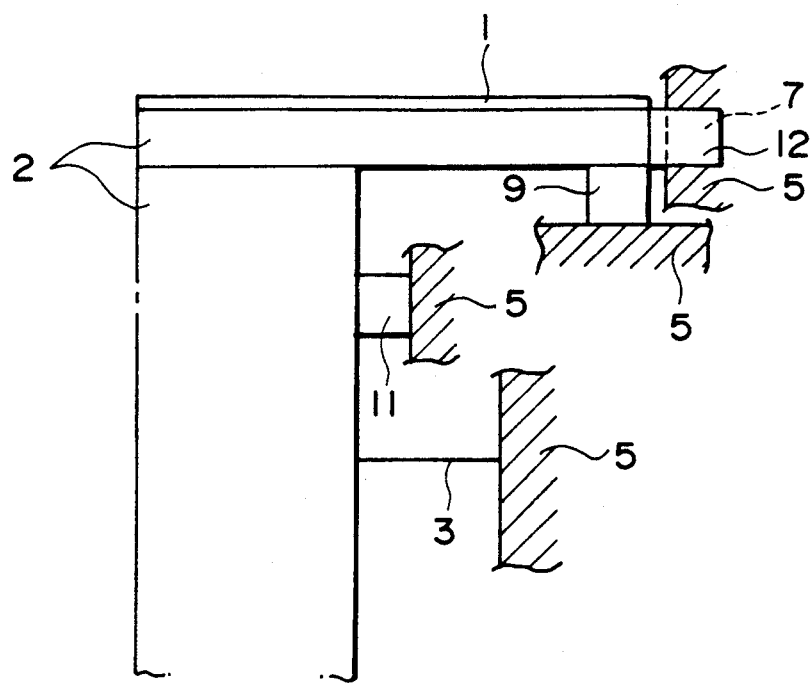
FIG. 7 is a schematic view showing a mounting portion for a piezoelectric device means of a workpiece supporting mechanism according to a second embodiment of the present invention.
Figure 8:
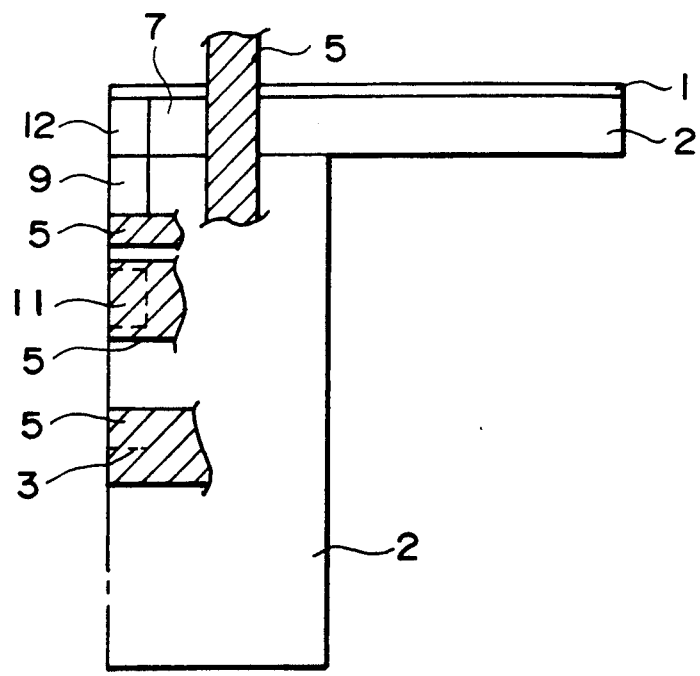
FIG. 8 is a side view of the mechanism of the FIG. 7 embodiment.

FIG. 7 is a schematic view showing a mounting portion for a piezoelectric device means, in a workpiece supporting mechanism according to another embodiment of the present invention. In this embodiment, the manner of mounting the piezoelectric device means is changed, as compared with that in the FIG. 2 apparatus. FIG. 8 is a side view of the mechanism of the present embodiment. For simplification, only a right-hand half of the workpiece support 2 is illustrated, and like numerals as those in FIG. 2 are used.

In this embodiment, as compared with the first embodiment described in the foregoing, piezoelectric devices 7, 9 and 11 each is fixed directly to a stage 5. As a consequence, by applying a DC voltage to each of these piezoelectric devices 7, 9 and 11, it is possible to keep the workpiece 1 and the workpiece support 2 in a certain displaced state relative to the stage 5. Accordingly, the present embodiment has an additional effect that the alignment or focusing of the workpiece 1 can be attained by using the piezoelectric device means.

Figure 9:
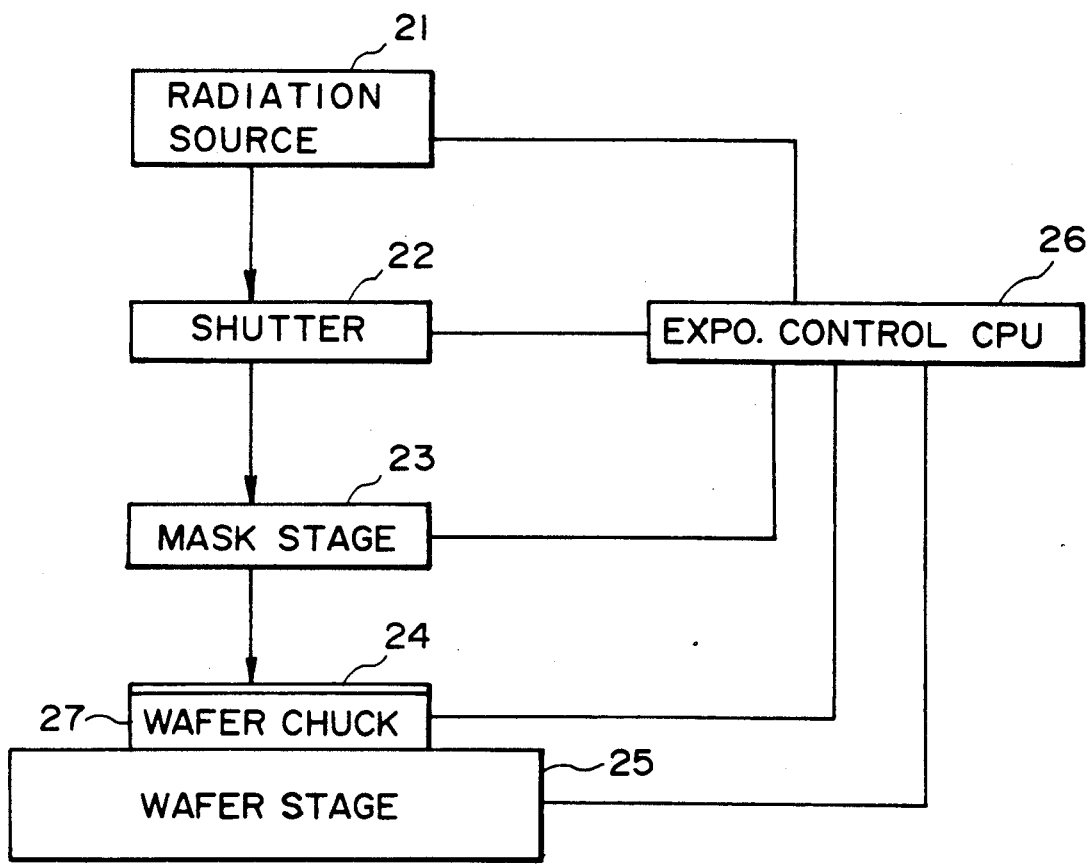
FIG. 9 is a schematic and diagrammatic view showing a general structure of an exposure apparatus to which the present invention is applied.

FIG. 9 is a block diagram showing a general structure of an exposure apparatus, arranged in accordance with an aspect of the present invention. Denoted in this Figure at 21 is a radiation source such as a synchrotron orbit radiation (SOR) source, for example, at 22 is a shutter; at 23 is a mask; at 24 is a wafer; and at 25 is an X-Y-$\theta$ stage for positioning the wafer. Denoted at 26 is a control CPU, and at 27 is a workpiece holder for holding the workpiece (wafer).

In operation, a radiation beam emanating from the radiation source is projected on the mask through the shutter and, by projection of a pattern of the mask upon the wafer, projection exposure of the wafer is executed.

Figure 10:
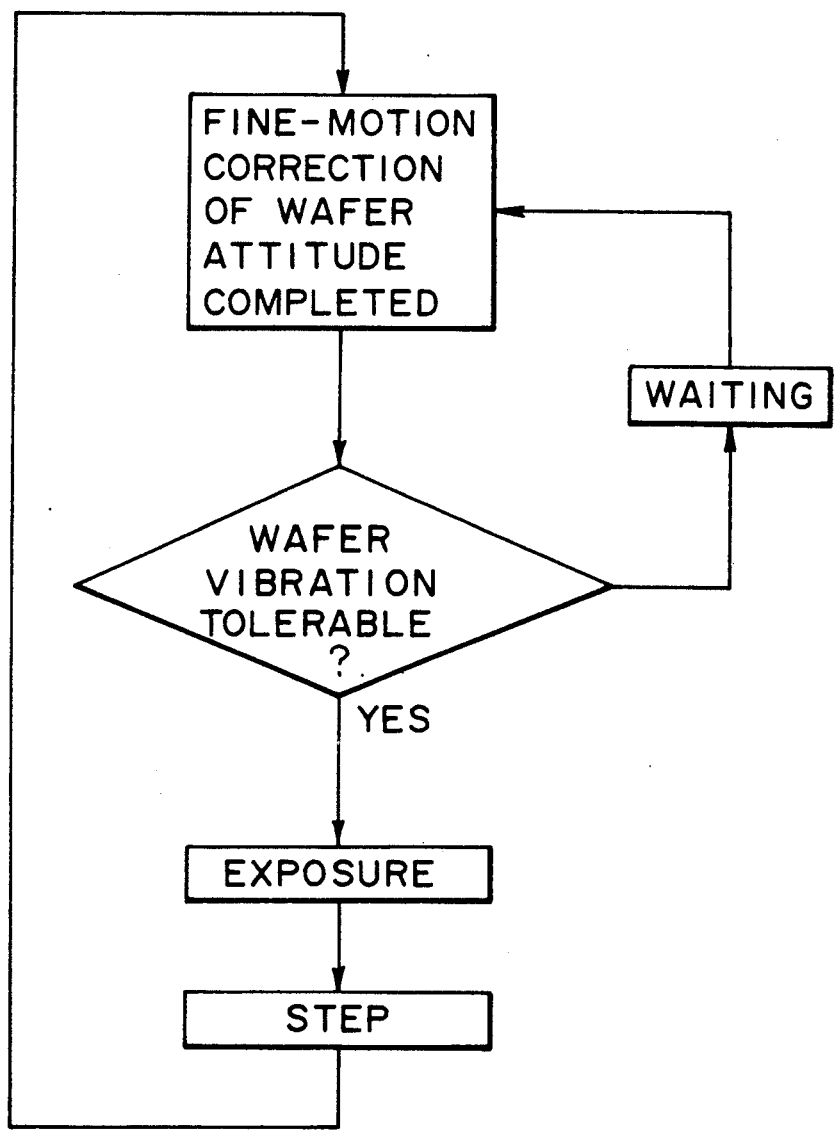
FIG. 10 is a flow chart showing an example of exposure control, made in accordance with the present invention.

FIG. 10 is a flow chart for explaining an example of an exposure control method to be performed when the invention is embodied. Explanation will be made, taken in conjunction with this flow chart. Even if the vibration is reduced positively by the method having been described in the foregoing, if the amplitude is large, a time period of a certain degree is necessary to attenuate such vibration. If, on such an occasion, the exposure is made before the vibration is attenuated sufficiently, there occurs a pattern transfer error, for example. The exposure control method of the present example can solve such a problem.

For convenience of explanation, it is now assumed that the vibration has a single mode about the z-axis; that it, has only one natural vibration frequency of $f_0$ (Hz); and that the tolerance for the vibration in the direction about the z axis, at the position of the acceleration sensor, is X (micron) (on this occasion, the tolerance represents a critical value of the amplitude with which no adverse effect is applied to the exposure, and such a value can be detected in preparation by experiments). First, the acceleration a (micron/sec$^2$) in the direction about the z axis, before the exposure, is calculated on the basis of an output of the acceleration sensor and, by using a calculated value, the amplitude of the vibration $a/(2\pi f_0)^2$ . . . (1), at the acceleration sensor position, is detected. Subsequently, discrimination is made as to whether a relationship: $X \geq a/(2\pi f_0)^2$ . . . (2) is satisfied or not. If the result is negative, the exposure is postponed until the relation is satisfied. This control method provides an advantageous effect that deterioration in the resolution due to the vibration can be prevented. The specific controls are made under the influence of the CPU 26 (FIGS. 2 and 9).

Figure 11:
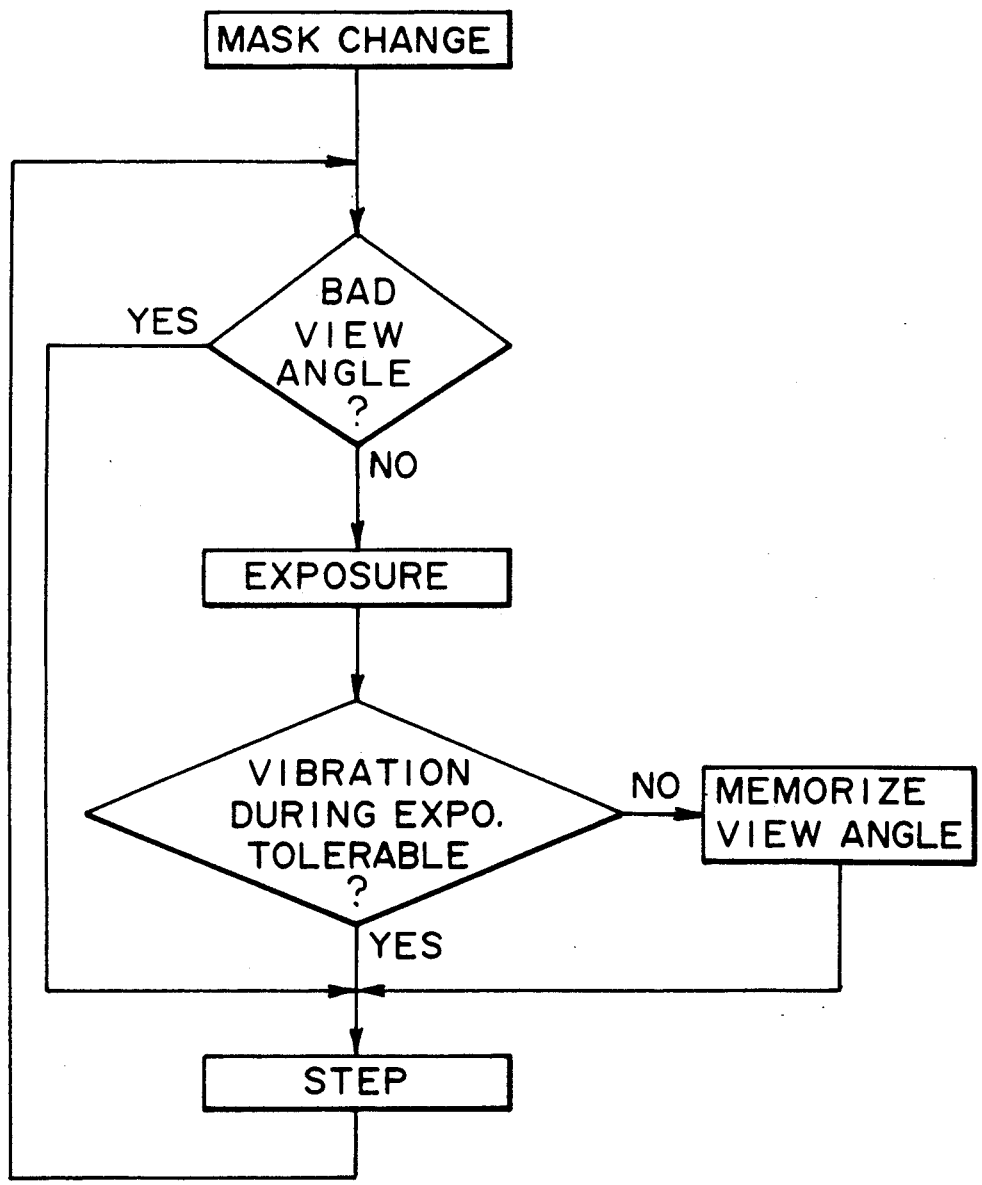
FIG. 11 is a flow chart showing another example of exposure control.

Further, if during the exposure a relation $X \leq a/(2\pi f_0)^2$ is satisfied, in the succeeding process and the processes following it the exposure of that view angle is prohibited, with a result of an advantage of improved throughput. The flow of such a sequence is illustrated in FIG. 11. Briefly, in accordance with this sequence, first the acceleration in each direction during the exposure is calculated on the basis of an output of a corresponding acceleration sensor. Then, by using the result of the calculation, the amplitude of the vibration at the acceleration sensor position is detected in accordance with equation (1). If the detected amplitude satisfies the condition of equation (2), the exposure is continued. If the condition is not satisfied, the exposure is stopped immediately or, alternatively, such a shot area is skipped wherein the exposure of the next shot area is conducted. The address of that view angle with respect to which a vibration greater than the tolerance has occurred is memorized by a CPU. Thus, the exposure control is made for the next process and the processes following it, so that the memorized address is skipped in accordance with the stored data. The monitoring may be made continuously during the exposure. By the 6 described method, the throughput can be improved significantly. This method is particularly effective in a step-and-repeat type exposure apparatus, called a "stepper".

Figure 12:
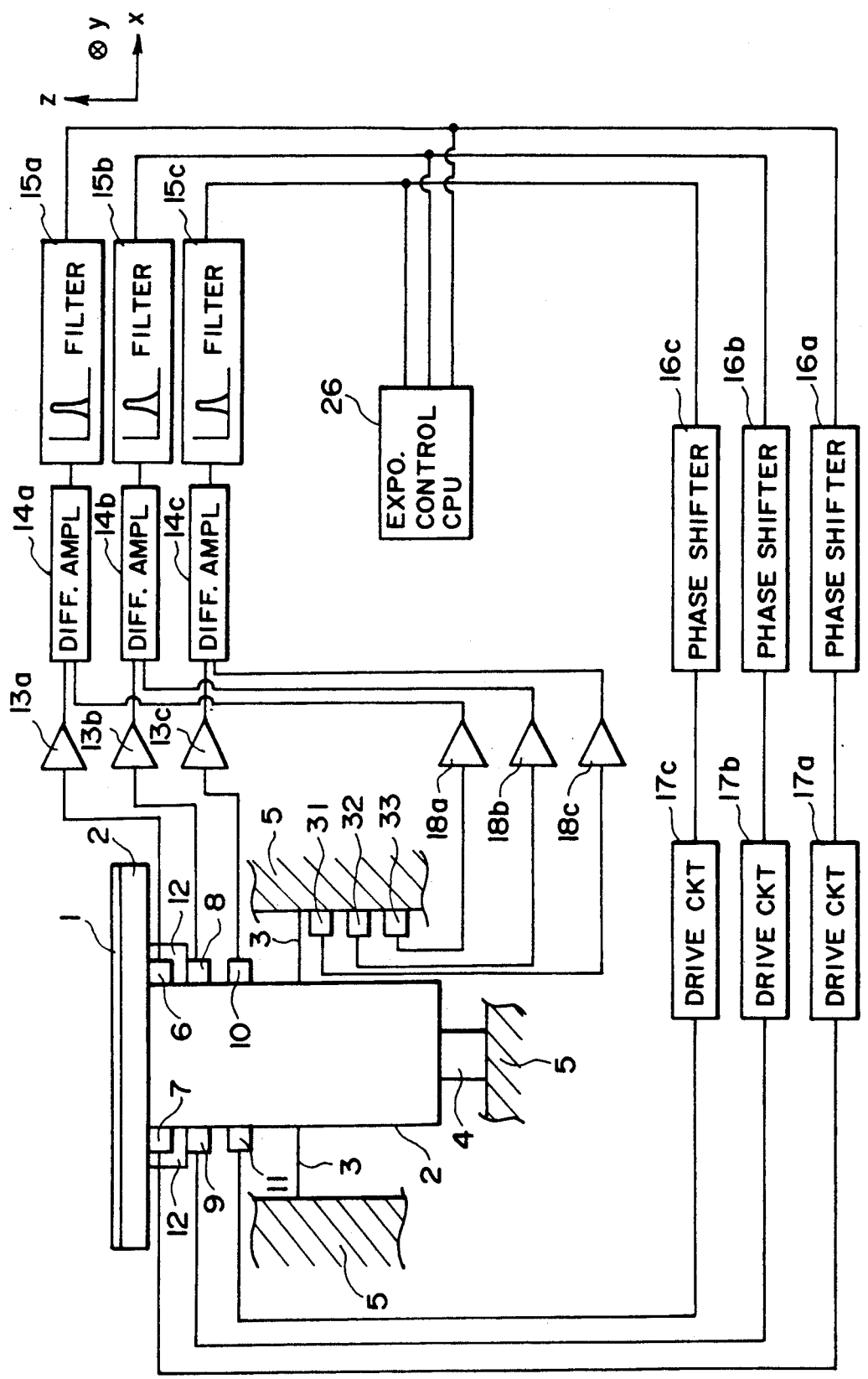
FIG. 12 is a schematic and diagrammatic view showing a general structure of a workpiece supporting mechanism according to a third embodiment of the present invention.

Next, a third embodiment of the present invention will be explained. FIG. 12 is a schematic and diagrammatic view showing the third embodiment of the present invention. Like numerals are assigned to those elements having similar or corresponding functions. Denoted in this Figure at 31, 32 and 33 are acceleration sensors each for detecting an acceleration of a stage 5; denoted at 13a, 13b and 13c are amplifiers for amplifying the outputs of the acceleration sensors 6, 8 and 10, respectively; at 14a, 14b and 14c are differential amplifiers each for amplifying a difference between the output of a corresponding one of the acceleration sensors 31, 32 and 33 and the output of a corresponding one of the acceleration sensors 6, 8 and 10; at 15a, 15b and 15c are filters each being adapted to extract a particular signal component of the output signal from a corresponding one of the differential amplifiers; at 16a, 16b and 16c are phase shifters each being operable to change the phase of the signal from corresponding one of the acceleration sensors 6, 8 and 10 and a signal to be applied to a corresponding one of vibrators 7, 9 and 11, each comprising a piezoelectric device, for example, for applying a force to the workpiece support 2 (to cause displacement); at 17a, 17b and 17c are driving circuits for actuating the vibrators 7, 9 and 11, respectively; and at 18a, 18b and 18c are amplifiers for amplifying the outputs of the acceleration sensors 31, 32 and 33, respectively.

The mechanism of the present embodiment is so structured that any relative vibration of the stage 5 and the workpiece support 2 is cancelled by the vibrators 7, 9 and 11.

The operation of the present embodiment, having the structure described above, will be explained. Also in this embodiment, for simplification of explanation, description will be made to the operation to be made to suppress the vibration in a rotational direction about the z axis. The acceleration of the stage 5 and the acceleration in a direction about the z axis, caused as a result of application of an external force to the workpiece support 2, can be sensed by the acceleration sensors 6 and 33 whose signals are amplified by the amplifiers 13a and 18a, respectively. These amplified signals are inputted into the differential amplifier 14a, whereby a difference therebetween is amplified. The output of this differential amplifier 14 is proportional to the relative acceleration between the workpiece support 2 and the stage 5.

Assuming now that the amplifiers 13a and 18a have the same characteristic and that their gains are constant, then the gain of the differential amplifier is determined as follows: If, on an occasion when the amplitude of the workpiece support 2 relative to the stage 5 is x (micron), an electric voltage to be applied to the piezoelectric device 7 for vibrating the workpiece support 2 by x (micron) relative to the stage 5 is denoted by Vp, then the gain is adjusted so that the differential amplifier 14a produces an output of Vp.

The embodiment described in the foregoing is based on such a consideration that a major vibration is dominated by such a natural vibration frequency as having a low frequency or an outstanding peak and, on the other hand, the other frequency or frequencies produces vibration only of a low level, as compared with that by the former. Thus, the gain is so set as to cancel the displacement at such a natural vibration frequency, and the output of an acceleration sensor, at every frequency, is amplified and then is inputted into the piezoelectric device 7. In the present embodiment, as compared therewith, a filter means effective to intercept the aforesaid other frequency or frequencies is used, in order to obtain a better result. More specifically, by using such filter means, only such a signal component, of the output signal from the differential amplifier, that corresponds to the natural vibration frequency which dominates the vibration, is extracted and, thus, those signal components corresponding to the other frequencies are intercepted. This is effective to prevent any external force of a frequency, other than that which functions to cancel the displacement at the natural vibration frequency dominating the vibration, from being applied by the piezoelectric device to the workpiece support 2.

Additionally, in order to ensure further reduction in vibration, phase adjustment is made to the output signal of the filter 15a, by using the phase shifter 16a. Namely, depending on the mass of the workpiece support 2 and the rigidity of the leaf spring 3 and the shaft member 4, supporting the workpiece support 2, there is a lag in phase between the vibration application to the workpiece support 2 and the response thereof, and the above adjustment is made so as to correct or compensate such a phase difference.

The function of the exposure control CPU is substantially the same as that described in the foregoing, and description thereof will be omitted here. As regards the mounting of the piezoelectric device, namely, the vibrator, it may be fixed to the stage 5 so that it can apply displacement to the workpiece support 2, as in the foregoing embodiments.

While, in the embodiments described above, the displacement resulting from the force received by the workpiece support is detected by using an acceleration sensor, and a displacement that cancels the detected displacement is produced at a piezoelectric device to thereby reduce the vibration, substantially the same advantageous effects are attainable in the following arrangement:

Namely, by using an acceleration sensor, the acceleration a having been applied to the workpiece support is detected. When an equivalent mass of the workpiece support is denoted by M, the force F received by this workpiece support can be represented by $F=Ma$. Thus, by using a vibrator or otherwise, such a force that can cancel the received force F can be applied to the workpiece support, to thereby reduce or suppress the vibration.

While the invention has been described with reference to the structures disclosed herein, it is not confined to the details set forth and this application is intended to cover such modifications or changes as may come within the purposes of the improvements or the scope of the following claims.

What is claimed is:

1. A device for supporting a plate-like member, said device comprising:
   a supporting member for supporting the plate-like member;
   a sensor mounted to said supporting member, for producing a signal corresponding to a displacement of said supporting member; and
   displacement producing means, responsive to the signal from said sensor, for producing a displacement of said supporting member,
   wherein said displacement producing means comprises driving means including a vibrator.

2. A device according to claim 1, wherein said displacement producing means is mounted to said supporting member.

3. A device for supporting a plate-like member, said device comprising:
   a supporting member for supporting the plate-like member;
   a sensor mounted to said supporting member, for producing a signal corresponding to vibration of said supporting member;
   displacement producing means, responsive to the signal from said sensor, for producing a displacement of said supporting member; and
   supporting means for supporting said supporting member,
   wherein said displacement producing means is mounted to said supporting means.

4. A device for supporting a plate-like member, said device comprising:

a supporting member for supporting the plate-like member;

a sensor mounted to said supporting member, for producing a signal corresponding to a displacement of said supporting member; and displacement producing means, responsive to the signal from said sensor, for producing a displacement of said supporting member, wherein said sensor comprises one of an acceleration sensor and a speed sensor.

5. A device according to claim 4, further comprising an amplifier for amplifying the signal from said sensor and for applying the amplified signal to said displacement producing means.

6. An apparatus for transferring a pattern of an original to a workpiece, said apparatus comprising:

means for supporting the workpiece;

a stage for supporting said workpiece supporting means;

sensing means mounted to said workpiece supporting means; for producing a signal corresponding to a displacement of said workpiece supporting means; and displacement producing means responsive to the signal from said sensing means, to produce a displacement of said workpiece supporting means, wherein said displacement producing means comprises driving means including a vibrator.

7. An apparatus according to claim 6, wherein said displacement producing means is mounted to said workpiece supporting means.

8. An apparatus for transferring a pattern of an original to a workpiece, said apparatus comprising:

means for supporting the workpiece;

a stage for supporting said workpiece supporting means;

sensing means mounted to said workpiece supporting means, for producing a signal corresponding to vibration of said workpiece supporting means; and displacement producing means responsive to the signal form said sensing means, to produce a displacement of said workpiece supporting means, wherein said displacement producing means is mounted to said stage.

9. An apparatus for transferring a pattern of an original to a workpiece, said apparatus comprising:

means for supporting the workpiece;

a stage for supporting said workpiece supporting means;

sensing means mounted to said workpiece supporting means, for producing a signal corresponding to a displacement of said workpiece supporting means; and displacement producing means responsive to the signal from said sensing means, to produce a displacement of said workpiece supporting means, wherein said sensing means comprises one of an acceleration sensor and a speed sensor.

10. An apparatus according to claim 9, further comprising an amplifier for amplifying the signal from said sensing means and for applying the amplified signal to said displacement producing means.

11. A device for supporting a plate-like member, comprising:

a supporting member for supporting the plate-like member;

means for supporting said supporting member;

a first sensor mounted to said supporting member, for producing a signal corresponding to a displacement of said supporting member;

a second sensor mounted to said supporting means, for producing a signal corresponding to a displacement of said supporting means;

means for amplifying a difference between the signals from said first and second sensors; and means, responsive to an output of said amplifying means, to produce a displacement in said supporting member.

12. A device according to claim 11, wherein said displacement producing means includes driving means having a vibrator.

13. A device according to claim 11, wherein said displacement producing means is mounted to said supporting means.

14. A device according to claim 11, wherein said displacement producing means is mounted to said supporting member.

15. A device according to claim 11, further comprising phase shifting means for adjusting a phase of an output of said amplifying means and for applying the phase-adjusted output to said displacement producing means.

16. A device according to claim 11, further comprising filtering means for extracting a predetermined component, out of the output of said amplifying means.

17. An exposure method for transferring a pattern of an original to a workpiece, said method comprising the steps of:

detecting a displacement of the workpiece or of a supporting member supporting the workpiece;

discriminating whether or not the detected displacement is not greater than a predetermined tolerance set in relation to the exposure; and executing the exposure after the detected displacement is discriminated as being not greater than the tolerance, wherein the exposure is postponed while the detected displacement is discriminated as being greater than the tolerance, and until the displacement becomes not greater than the tolerance, and wherein the displacement is represented by $a/(2\pi f_0)^2$ where a is an acceleration of the supporting member and $f_0$ is a natural frequency that dominates the vibration of the supporting member.

18. A method according to claim 17, wherein the tolerance is determined by a critical value concerning the amplitude, with which substantially no effect is applied to the exposure.

19. An exposure method for transferring, in sequence, a pattern of an original to difference portions of a workpiece, said method comprising the steps of:

detecting a displacement of the workpiece or a supporting member supporting the workpiece, during the exposure;

discriminating whether the detected displacement is not greater than a tolerance determined in relation to the exposure; and continuing the exposure as the detected displacement is discriminated as being not greater than the tolerance;

wherein the exposure of a current portion of the workpiece is stopped and the exposure of a next portion of the workpiece is initiated, as the detected displacement is discriminated as being greater than the tolerance, and wherein the displacement is represented by $a/2\pi f_0)^2$ where a is an acceleration of the supporting member and $f_0$ is a natural frequency that dominates the vibration of the supporting member.

20. A method according to claim 19, wherein the tolerance is determined by a critical value concerning the amplitude with which substantially no effect is applied to the exposure.

21. An exposure method for transferring, in sequence, a pattern of an original to different portions of a workpiece, said method comprising the steps of:
   detecting a displacement of the workpiece or a supporting member supporting the workpiece, during the exposure;
   discriminating whether the detected displacement is not greater than a tolerance determined in relation to the exposure;
   continuing the exposure of a current portion of the workpiece, as the detected displacement is discriminated as being not greater than the tolerance; and
   memorizing an address of such portion of the workpiece with respect to which the detected displacement is discriminated as being greater than the tolerance, and
   wherein the displacement is represented by $a/(2\pi f_0)^2$ where a is an acceleration of the supporting member and $f_0$ is a natural frequency that dominates the vibration of the supporting member.

22. A method according to claim 21, wherein the tolerance is determined by a critical value concerning the amplitude with which substantially no effect is applied to the exposure.

23. A substrate supporting device comprising:
   a supporting member for supporting a substrate onto which a pattern is to be printed;
   a detector for producing a signal corresponding to vibration of said supporting member; and
   an actuator for suppressing the vibration of said supporting member, said actuator being controlled in accordance with the signal from said detector.

24. A device according to claim 23, further comprising a second detector and a second actuator, each of the detectors and each of the actuators being provided in pairs in relation to said supporting member.

25. A device according to claim 24, wherein said pairs of detectors and said pair of actuators respectively operate in different directions in relation to the vibration.

26. A substrate supporting device comprising:
   a supporting member for supporting a substrate onto which a pattern is to be printed;
   a stage for supporting said supporting member;
   a detector for detecting vibration of said supporting member; and
   an actuator provided as a unit with said stage, for suppressing the vibration of said supporting member, said actuator acting on said supporting member to reduce the vibration of said supporting member detected by said detector.

27. A device according to claim 26, further comprising a second detector and a second actuator, each of the detectors and each of the actuators being provided in pairs in relation to said supporting member.

28. A device according to claim 27, wherein said pairs of detectors and said pairs of actuators respectively operate in different directions in relation to the vibration.

29. A substrate supporting device comprising:
   a first member for supporting a substrate onto which a pattern is to be printed;
   a second member for supporting said first member;
   a first detector for producing a first signal related to vibration of said first member;
   a second detector for producing a second signal related to vibration of said second member; and
   an actuator operable in accordance with the first and second signals from said first and second detectors, to suppress the vibration of said first member.

30. An exposure method comprising the steps of:
   detecting vibration of a supporting member which supports a substrate onto which a pattern is to be printed;
   actuating a vibrator to suppress the vibration of the supporting member when the detected vibration is greater than a predetermined level; and
   exposing the substrate to print the pattern thereon when the detected vibration is not greater than the predetermined level.

* * * * *

UNITED STATES PATENT AND TRADEMARK OFFICE
CERTIFICATE OF CORRECTION

PATENT NO. : 5,155,523
DATED : October 13, 1992
INVENTOR(S) : Shinichi Hara, et al.

It is certified that error appears in the above-identified patent and that said Letters Patent is hereby corrected as shown below:

ON THE COVER PAGE

Before the Abstract, Insert --Attorney, Agent or Firm --Fitzpatrick, Cella, Harper & Scinto--.

COLUMN 1

Line 12, "a exposure" should read --of an exposure--.

COLUMN 3

Line 36, "device" should read --devices--;
Line 38, "device" should read --devices--;
Line 64, "such as" should read --such a--; and
Line 69, "as" should read --a--.

COLUMN 5

Line 20, "as" should read --has--.

COLUMN 6

Line 6, "it," should read --is,--; and
Line 48, "6" should be deleted.

UNITED STATES PATENT AND TRADEMARK OFFICE
CERTIFICATE OF CORRECTION

PATENT NO. : 5,155,523
DATED : October 13, 1992
INVENTOR(S) : Shunichi Hara, et al.

It is certified that error appears in the above-identified patent and that said Letters Patent is hereby corrected as shown below:

COLUMN 7

Line 3, "corresponding" should read --a corresponding--; and
Line 32, "characteristic" should read --characteristics--.

COLUMN 9

Line 42, "form" should read --from--.

COLUMN 11

Line 1, "a/2$\pi f_0)^2$" should read --a/(2$\pi f_0)^2$--.

Signed and Sealed this

Sixteenth Day of November, 1993

Attest:

BRUCE LEHMAN

*Attesting Officer*            *Commissioner of Patents and Trademarks*